(12) United States Patent
Wang et al.

(10) Patent No.: US 12,236,028 B2
(45) Date of Patent: Feb. 25, 2025

(54) FLEXIBLE CIRCUIT BOARD AND MANUFACTURING METHOD THEREOF, TOUCH PANEL AND MANUFACTURING METHOD THEREOF

(71) Applicant: BOE TECHNOLOGY GROUP CO., LTD., Beijing (CN)

(72) Inventors: Jiuzhen Wang, Beijing (CN); Meizhu Zheng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 315 days.

(21) Appl. No.: 17/421,899

(22) PCT Filed: Sep. 2, 2020

(86) PCT No.: PCT/CN2020/113073
§ 371 (c)(1),
(2) Date: Jul. 9, 2021

(87) PCT Pub. No.: WO2022/047676
PCT Pub. Date: Mar. 10, 2022

(65) Prior Publication Data
US 2022/0342498 A1    Oct. 27, 2022

(51) Int. Cl.
*G06F 3/041* (2006.01)
*H05K 1/18* (2006.01)

(52) U.S. Cl.
CPC ............. *G06F 3/041* (2013.01); *H05K 1/189* (2013.01); *G06F 2203/04102* (2013.01); *G06F 2203/04103* (2013.01)

(58) Field of Classification Search
CPC ........... G06F 3/041; G06F 2203/04102; G06F 2203/04103; G06F 3/04164; H05K 1/189;
(Continued)

(56) References Cited

U.S. PATENT DOCUMENTS 8,553,364 B1 * 10/2013 Schreiber ............... G11B 5/486
                                                        360/245.9
9,178,295 B1 * 11/2015 Lin ........................ H01R 12/62
(Continued)

FOREIGN PATENT DOCUMENTS

CN    1792126        6/2006
CN    1792126  A     6/2006
(Continued)

OTHER PUBLICATIONS

Office action from Chinese Application No. 202080001781.X dated Apr. 24, 2023.
Written Opinion from PCT/CN2020/113073 dated May 24, 2021.

*Primary Examiner* — Temesghen Ghebretinsae
*Assistant Examiner* — Karin Kiyabu
(74) *Attorney, Agent, or Firm* — Calfee, Halter & Griswold LLP

(57) ABSTRACT

A flexible circuit board has a first binding area and a bending area. The flexible circuit board includes a flexible substrate, a conductor layer, a first protective layer, and a plurality of first binding pins. The plurality of first binding pins is arranged in the first binding area on the flexible substrate. The orthographic projection on the flexible substrate of an edge line of each first binding pin is located within the edge of the flexible substrate, wherein the edge line is located at an end along the extension direction of the first binding pin. The conductor layer is arranged in the bending area on the flexible substrate. The conductor layer is connected with the first binding pins. The first protective layer is arranged on the side of the conductor layer away from the flexible substrate.

14 Claims, 5 Drawing Sheets

(58) Field of Classification Search
CPC ........ H05K 1/117; H05K 1/118; H05K 1/147; H05K 2201/10128; H05K 3/361
See application file for complete search history.

(56) References Cited

U.S. PATENT DOCUMENTS

| | | | | |
|---|---|---|---|---|
| 9,235,286 | B2* | 1/2016 | Nakano | G06F 3/0412 |
| 11,119,616 | B2* | 9/2021 | Rahmani | H05K 1/14 |
| 2006/0289203 | A1 | 12/2006 | Oda | |
| 2010/0207279 | A1* | 8/2010 | Law | H01L 24/73 |
| | | | | 257/E21.511 |
| 2012/0325524 | A1* | 12/2012 | Naganuma | H05K 3/4691 |
| | | | | 29/830 |
| 2013/0083505 | A1* | 4/2013 | Kobayashi | H05K 1/0245 |
| | | | | 174/250 |
| 2013/0264103 | A1* | 10/2013 | Ye | H05K 3/38 |
| | | | | 174/254 |
| 2014/0069567 | A1* | 3/2014 | Grespan | B32B 41/00 |
| | | | | 156/379 |
| 2015/0160760 | A1* | 6/2015 | Sato | G06F 1/1626 |
| | | | | 345/174 |
| 2018/0146549 | A1* | 5/2018 | Kim | H05K 3/361 |
| 2020/0301543 | A1* | 9/2020 | Feng | G06F 3/0443 |
| 2021/0037646 | A1 | 2/2021 | Xiao | |
| 2022/0272832 | A1* | 8/2022 | Gong | H05K 1/028 |

FOREIGN PATENT DOCUMENTS

| | | | | |
|---|---|---|---|---|
| CN | 103367947 | A | | 10/2013 |
| CN | 104752234 | A | | 7/2015 |
| CN | 105224115 | A | * | 1/2016 |
| CN | 105228343 | A | * | 1/2016 |
| CN | 107611160 | A | | 1/2018 |
| CN | 109757031 | A | | 5/2019 |
| CN | 109831871 | A | | 5/2019 |
| CN | 107611160 | B | * | 9/2019 |
| CN | 110505756 | A | | 11/2019 |
| CN | 109831871 | B | | 2/2020 |
| CN | 110825268 | A | | 2/2020 |
| CN | 210137483 | U | | 3/2020 |
| CN | 109757031 | B | | 8/2020 |
| JP | 2004079731 | A | * | 3/2004 |
| KR | 20140123771 | A | * | 10/2014 |
| KR | 20150090697 | A | * | 8/2015 |
| WO | 2002003767 | A1 | | 1/2002 |
| WO | 2020151391 | | | 7/2020 |
| WO | 2020151391 | A1 | | 7/2020 |
| WO | 2020151423 | | | 7/2020 |
| WO | 2020151423 | A1 | | 7/2020 |
| WO | WO-2022042082 | A1 | * | 3/2022 ............ G06F 3/041 |

* cited by examiner

FLEXIBLE CIRCUIT BOARD AND MANUFACTURING METHOD THEREOF, TOUCH PANEL AND MANUFACTURING METHOD THEREOF

CROSS-REFERENCE TO RELATED APPLICATION

The present application is a 35 U.S.C. 371 national phase application of PCT International Application No. PCT/CN2020/113073 filed on Sep. 2, 2020, the entire disclosure of which is incorporated herein as a part of the present application for all purposes.

TECHNICAL FIELD

The present disclosure relates to the field of display technology, and in particular to a flexible circuit board and a manufacturing method of the flexible circuit board, a touch panel including the flexible circuit board, and a manufacturing method of the touch panel.

BACKGROUND

As a new type of light-emitting device, Organic Light-Emitting Diode (OLED) has been greatly researched and applied in the field of display technology. With the advent of foldable products, various foldable display products have given OLED a new mission. However, due to the foldability of display products, many new issues need to be paid attention to when designing display products.

At present, the manufacture of various bendable display products is not difficult, but how to ensure the bending performance of the display products in the terminal has always been the focus of various manufacturers' research. As a functional unit of the display panel, reliability improvement of the touch module has always been the focus of research. However, with the thinning of the touch panel, the flexible circuit board is easy to short circuit, difficult to bend, and the substrate is easy to break during bonding, to deform when bending.

It should be noted that the information disclosed in the background section above is only used to enhance the understanding of the background of the present disclosure, and therefore may include information that does not constitute the prior art known to those of ordinary skill in the art.

SUMMARY

According to an aspect of the present disclosure, there is provided a flexible circuit board having a first bonding area and a bending area. The flexible circuit board includes:
a flexible substrate;
a plurality of first bonding pins, arranged in the first bonding area on the flexible substrate, wherein the orthographic projection on the flexible substrate of an edge line of each first bonding pin is located within the edge of the flexible substrate, which edge line is located at an end along the extension direction of the first bonding pin;
a conductor layer, provided in the bending area on the flexible substrate, wherein the conductive layer is connected to the first bonding pins; and
a first protective layer, arranged on the side of the conductor layer away from the flexible substrate.

In an exemplary embodiment of the present disclosure, the width of an end of each first bonding pin close to the edge of the flexible substrate is smaller than that of a part of the first bonding pin away from the edge of the flexible substrate.

In an exemplary embodiment of the present disclosure, a plurality of notches are provided at an end of the flexible substrate close to the first bonding pins, and each of the notches is located between two adjacent first bonding pins.

In an exemplary embodiment of the present disclosure, the width of the opening part of the notch is greater than the width of the side part of the notch away from the opening part.

In an exemplary embodiment of the present disclosure, the conductor layer includes a first conductive metal layer and a second conductive metal layer, and each of the first bonding pins includes a first conductive metal layer and a second conductive metal layer.

According to an aspect of the present disclosure, a touch panel is provided, including:
a touch module, having a second bonding area;
the flexible circuit board according to any one of the above embodiments, wherein the first bonding area of the flexible circuit board is bound to the second bonding area of the touch module;
a bonding adhesive layer, arranged between the second bonding area of the touch module and the first bonding area of the flexible circuit board.

In an exemplary embodiment of the present disclosure, the touch control module includes:
a second protective layer;
a first cover layer, arranged on the second protective layer;
a touch layer, provided on the side of the first cover layer away from the second protective layer;
a second cover layer, provided on the side of the touch layer away from the second protective layer, wherein the orthographic projection on the touch layer of an edge line of an end of the second cover layer is located within the touch layer, so that a part of the touch layer is exposed to form the second bonding area of the touch module.

In an exemplary embodiment of the present disclosure, the bonding glue layer comprises a conductive particle glue with a diameter greater than or equal to 5 microns and less than or equal to 10 microns.

In an exemplary embodiment of the present disclosure, the flexible circuit board further includes a protective film, provided in the bending area on a side of the flexible substrate away from the conductor layer.

According to an aspect of the present disclosure, there is provided a method for manufacturing a flexible circuit board, configured to manufacturer any one of the above-mentioned flexible circuit boards. The manufacturing method includes:
after performing a shadow process on via holes and before forming a photoresist, forming a first conductive material layer by flash plating on the conductor layer.

In an exemplary embodiment of the present disclosure, before performing the shadow process on the via holes, the method for manufacturing the flexible circuit board further includes:
providing a flexible substrate, and forming conductor layers on opposite sides of the flexible substrate;
forming via holes on the flexible substrate and the conductor layers; and
cleaning the via.

Besides, the photoresist is formed on a side of the first conductive material layer away from the flexible substrate, and after forming the photoresist, the manufacturing method of the flexible circuit board further includes:

removing the photoresist at the via holes;

forming a second conductive material layer on the side of the photoresist and the first conductive material layer away from the flexible substrate; and removing the remaining photoresist and the second conductive material layer on the side of the photoresist away from the flexible substrate.

According to an aspect of the present disclosure, there is provided a method for manufacturing a touch panel, configured to manufacture the touch panel described in any one of the above embodiments, including:

providing a flexible circuit board, which is manufactured by any one of the above-mentioned manufacturing methods for flexible circuit board;

provide a touch module; and bonding the touch module to the flexible circuit board.

In an exemplary embodiment of the present disclosure, when the touch module is bound to the flexible circuit board, the bonding indenter is pressed against the overlapping part, in the middle region thereof, between the plurality of second bonding pins of the touch module and the plurality of first bonding pins of the flexible circuit board.

In an exemplary embodiment of the present disclosure, the touch module is manufactured before the touch module is provided, and the method for manufacturing the touch module includes:

providing a rigid substrate;

forming a first cover layer on the rigid substrate;

forming a touch layer on a side of the first cover layer away from the rigid substrate;

forming a second cover layer on the side of the touch layer away from the rigid substrate;

irradiating the rigid substrate with ultraviolet light to peel off the first cover layer from the rigid substrate; and fitting the first cover layer on the second protective layer, wherein the rigid substrate is made of transparent glass, the materials of the first cover layer and the second cover layer are both photosensitive glue, and the material of the second protective layer is the optical material Cyclic Olefin Polymer (COP).

In an exemplary embodiment of the present disclosure, the method for manufacturing the touch panel further includes:

forming, in the bending area of the flexible circuit board, a protective glue layer on the side of the flexible substrate away from the conductor layer; and bending the flexible circuit board when the protective adhesive layer is not dry.

Other characteristics and advantages of the present disclosure will become apparent through the following detailed description, or partly learned through the practice of the present disclosure.

It should be understood that the above general description and the following detailed description are only exemplary and explanatory, and cannot limit the present disclosure.

BRIEF DESCRIPTION OF THE DRAWINGS

The drawings herein are incorporated into the specification and constitute a part of the specification, show embodiments in accordance with the present disclosure, and are used together with the specification to explain the principle of the present disclosure. Obviously, the drawings in the following description are only some embodiments of the present disclosure. For those of ordinary skill in the art, other drawings can be obtained based on these drawings without creative work.

Figure 1:
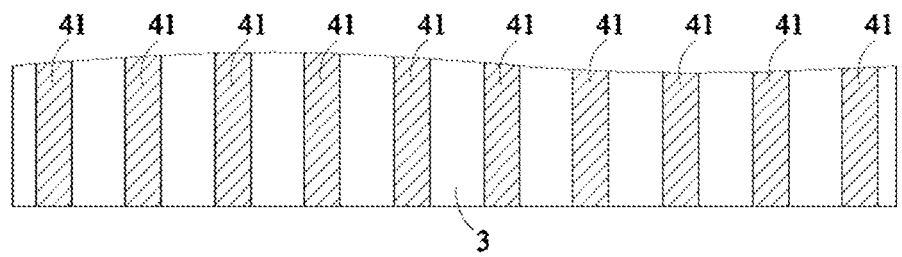
FIG. 1 schematically shows a structural diagram of a first bonding area of a flexible circuit board in the related art.

In the drawings:
1. first bonding area; 2. bending area;
3. flexible substrate; 31. notch;
41. first bonding pin; 42, conductor layer;
51. first protective layer; 52. conductive layer; 53, third protective layer; 54, electronic device; 55, metal support; 56, insulation layer; 57, first trench;
6. touch module; 61, second protective layer; 62, first cover layer; 63, touch layer; 64, second cover layer; 65, rigid substrate; 66, second bonding pin; 67, first trench;
7. bonding indenter; 8. conductive particle; 9. silicone pad; 10. flexible circuit board; 11. protective glue layer; 12. protective film;
131. first conductive metal layer; 132. second conductive metal layer.

DETAILED DESCRIPTION OF THE EMBODIMENTS

Example embodiments will now be described more fully with reference to the accompanying drawings. However, the example embodiments can be implemented in various forms, and should not be construed as being limited to the embodiments set forth herein. On the contrary, these embodiments are provided so that the present invention will be comprehensive and complete, and fully convey the concept of the example embodiments to those skilled in the art. The same reference numerals in the figures indicate the same or similar structures, and thus their detailed descriptions will be omitted.

Referring to the structural schematic diagram of the flexible circuit board in the related art shown in FIG. 1, the first bonding pins 41 in the flexible circuit boards are flush with the edge of the flexible substrate 3. During the bonding process, under the squeezing effect of the bonding indenter 7, the conductive particles 8 will flow toward the edge of the flexible substrate 3, thereby causing a short circuit between the first bonding pins 41. This problem is exacerbated when the flexible circuit board is designed to be thin.

Figure 2:
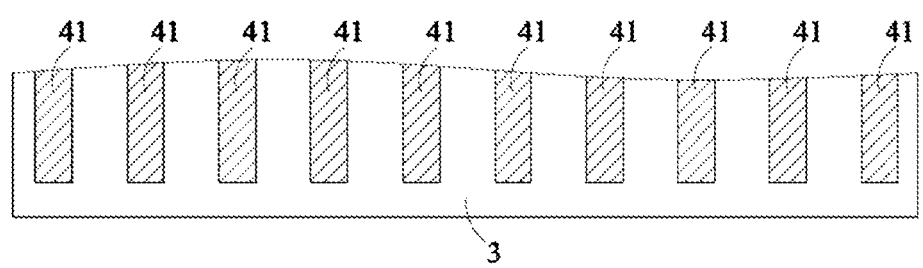
FIG. 2 schematically shows a structural diagram of a first bonding area of a flexible circuit board in an exemplary embodiment of the present disclosure.
Figure 5:
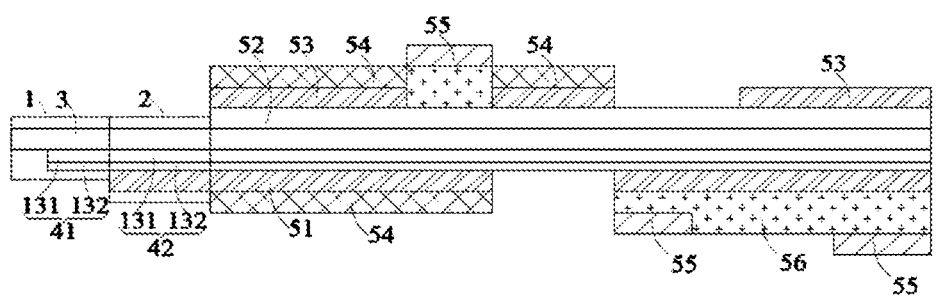
FIG. 5 schematically shows a schematic cross-sectional view of the flexible circuit board in FIG. 2.

An exemplary embodiment first provides a flexible circuit board, referring to the schematic structural diagrams of the flexible circuit board according to the present invention shown in FIG. 2 and FIG. 5. The flexible circuit board has a first bonding area 1 and a bending area 2. The flexible circuit board may include a flexible substrate 3, a conductor layer 42, a first protective layer 51, and a plurality of first bonding pins 41. The bonding pins 41 are provided in the first bonding area 1 on the flexible substrate 3. The orthographic projection on the flexible substrate 3 of an edge line of each bonding pin 41 is located within the edge of the flexible substrate 3, which edge line is located at an end along the extension direction of the first bonding pin 41. The conductor layer 42 is provided in the bending area 2 on the flexible substrate 3, and the conductor layer 42 is connected to the first bonding pins 41. The first protective layer 51 is provided on the side of the conductor layer 42 away from the flexible substrate 3.

Figure 12:
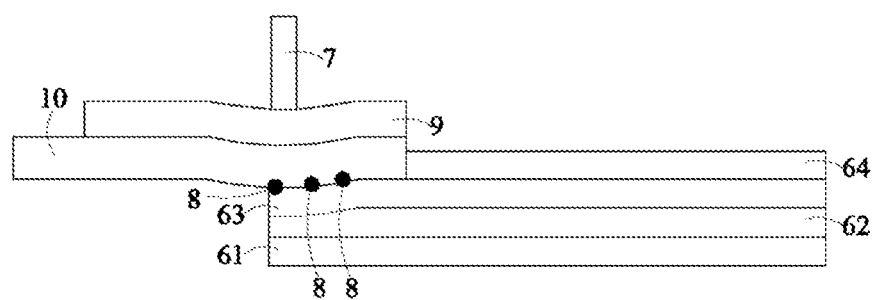
FIG. 12 schematically shows a structural diagram when the bonding indenter is pressed against the edge of the first bonding pin in the related art.

In an exemplary embodiment, referring to FIGS. 2 and 12, a plurality of first bonding pins 41 are provided, in the first bonding area 1 of the flexible circuit board, on the flexible substrate 3, and the plurality of first bonding pins 41 are are arranged side by side. The orthographic projection on the flexible substrate 3 of an edge line of the first bonding pin 41 is located within the edge of the flexible substrate 3, which edge line is located at an end along the extension direction of the first bonding pin 41. That is, the first bonding pin 41 does not extend to the edge of the flexible substrate 3. During the bonding process, even if the conductive particles 8 are squeezed to the edge of the flexible substrate 3 causing the conductive particles 8 to gather, it will not cause a short circuit among the plurality of first bonding pins 41.

Figure 3:
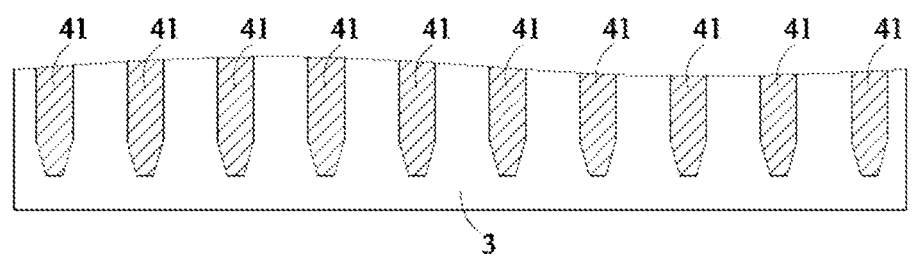
FIG. 3 schematically shows a structural diagram of a first bonding area of a flexible circuit board in another exemplary embodiment of the present disclosure.

With reference to FIGS. 3 and 12, in another exemplary embodiment of the present invention, an end of the first bonding pin 41 close to the edge of the flexible substrate 3 may be set in a trapezoidal shape, which the short base of the trapezoid is close to the edge of the flexible substrate 3, rendering the width of an end of the first bonding pin 41 close to the edge of the flexible substrate 3 to be smaller than the width of the part of the first bonding pin 41 away from the edge of the flexible substrate 3. Of course, the end of the first bonding pin 41 close to the edge of the flexible substrate 3 can also be set to be a triangle, so that the end of the first bonding pin 41 close to the edge of the flexible substrate 3 forms a sharp angle. An end of the first bonding pin 41 close to the edge of the flexible substrate 3 can be also set to be a rectangle, but the width of the rectangle is smaller than the width of the portion of the first bonding pin 41 away from the edge of the flexible substrate 3. In addition, an end of the first bonding pin 41 close to the edge of the flexible substrate 3 may also be set in an arc shape, for example, a semicircular shape, a semielliptical shape, and so on. This arrangement helps to increase the distance between the ends close to the edge of the flexible substrate 3 of two adjacent first bonding pins 41, so as to provide a larger gap for the conductive particles 8 to flow out of the edge. On the one hand, a short circuit will not be caused by the aggregation of conductive particles 8 at the edge. On the other hand, this design increases the overflow possibility of the conductive particles 8 to a certain extent and reduces the problem of aggregation. Thereby, the short circuit among the plurality of first bonding pins 41 is further avoided.

Figure 4:
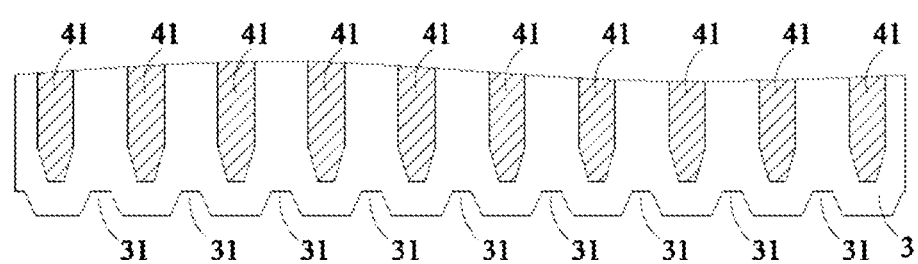
FIG. 4 schematically shows a structural diagram of a first bonding area of a flexible circuit board in still another exemplary embodiment of the present disclosure.

Referring to FIGS. 4 and 12, in another exemplary embodiment of the present invention, in addition to setting an end of the first bonding pin 41 close to the edge of the flexible substrate 3 to be narrow as in in FIG. 2, a plurality of notches 31 may be provided at an end of the flexible substrate 3 close to the first bonding pins 41, wherein each notch 31 is located between two adjacent first bonding pins 41. The width of the opening part of the notch 31 is larger than the width of the side part of the notch 31 away from the opening part. The opening part of the notch 31 is designed to be relative wide, mainly for the smooth flow of the conductive particle glue and avoiding aggregation. The shape of the notch 31 may be a trapezoid, wherein the long base of the trapezoid coincides with the edge of the flexible substrate 3, and the short base of the trapezoid is recessed into the flexible substrate 3 to form a notch 31 with an opening part larger than the bottom part. Of course, the shape of the notch 31 can also be a triangle, a semicircle, a semi-ellipse, etc., as long as the opening part of the notch 31 is designed to be relative wide, which will not be repeated here. The notch 31 further cuts off the physical connection between two adjacent first bonding pins 41. On the one hand, no short circuit occurs because of conductive particles 8 generated on the edge. On the other hand, this design increases to a certain extent the overflowing possibility of the conductive particles 8, thus reducing the problem of aggregation, and further avoiding a short circuit among the plurality of first bonding pins 41.

It should be noted that the setting of the notch 31 may not be based on the narrower end of the first bonding pin 41 close to the edge of the flexible substrate 3 in FIG. 2, but on the basis of FIG. 1.

With reference to FIG. 5, in an exemplary embodiment, the flexible circuit board may further include a conductor layer 42 and a first protective layer 51, wherein the conductor layer 42 is provided in the bending area 2 on the flexible substrate 3, and the conductor layer 42 is connected to the first bonding pins 41. That is, the conductor layer 42 and the first bonding pins 41 are located on the same side of the flexible substrate 3, and the conductor layer 42 and the first bonding pins 41 are arranged in the same layer by the same material. That is, the conductor layer 42 and the first bonding pins 41 are formed through the same patterning process. The first protective layer 51 is provided on the side of the conductor layer 42 away from the flexible substrate 3. That is, the first protective layer 51 is only provided on the side of the conductor layer 42 away from the flexible substrate 3, but is not provided on the side of the first bonding pins 41 away from the flexible substrate 3, and the first protective layer 51 covers the conductor layer 42 to protect the conductor layer 42. The thickness of the flexible substrate 3 may be greater than or equal to 7 microns and less than or equal to 12 microns, the yielding degree of the flexible substrate is greater than 280 MPA, and the thickness of the conductor layer 42 and the first bonding pins 41 are greater than or equal to 8 microns and less than or equal to 10 microns.

In an example embodiment, each of the first bonding pins 41 and the conductor layer 42 may include a first conductive metal layer 131 and a second conductive metal layer 132, wherein the first conductive metal layer 131 is fitted onto the flexible substrate 3 by pressing, and the second conductive metal layer 132 is formed on the side of the first conductive metal layer 131 away from the flexible substrate 3 by flash plating.

The flexible circuit board can be a single-layer flexible circuit board, or a double-layer flexible circuit board. Of course, it can also be a multilayer flexible circuit board. FIG. 5 shows a double-layer flexible circuit board. That is, a conductive layer 52 is provided on the side of the flexible substrate 3 away from the first bonding pins 41 and the conductor layer 42, a third protective layer 53 is provided on the side of the conductive layer 52 away from the flexible substrate 3, and a plurality of electronic devices 54 and a metal support 55 are provided on the side of the first protective layer 51 and the third protective layer 53 away from the flexible substrate 3, wherein an insulating layer 56 is provided on the side of the metal support 55 close to the flexible substrate 3.

Figure 6:
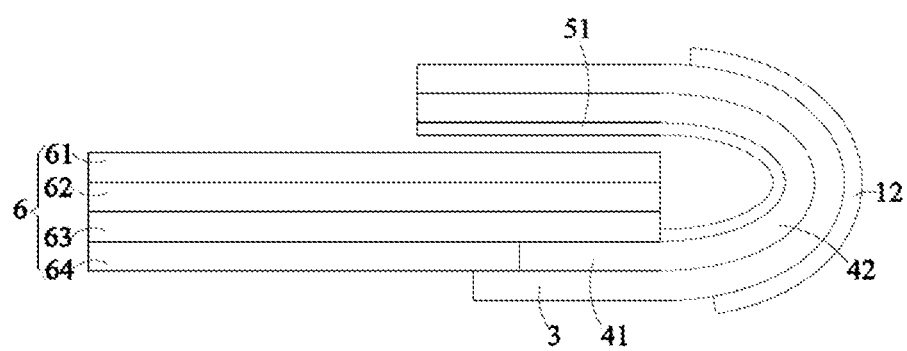
FIG. 6 schematically shows a structural diagram of a touch panel in an exemplary embodiment of the present disclosure.

Further, an example embodiment also provides a touch panel. As shown in FIG. 6, the touch panel may include a touch module 6 and any one of the above-mentioned flexible circuit boards. The touch module 6 also has a second bonding area. The first bonding area 1 of the flexible circuit board 10 is bound to the second bonding area of the touch module 6. The bonding adhesive layer is arranged between the second bonding area of the touch module 6 and the first bonding area 1 of the flexible circuit board 10. The specific structure of the flexible circuit board 10 has been described in detail above, so it will not be repeated here.

Figure 7:
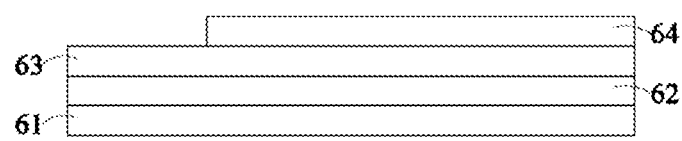
FIG. 7 schematically shows a structural diagram of the touch module in FIG. 6.

In an example embodiment, as shown in FIG. 7, the touch module 6 may include a second protective layer 61, a first cover layer 62, a touch layer 63, and a second cover layer 64. The first cover layer 62 is disposed on the second protective layer 61, the touch layer 63 is disposed on the side of the first cover layer 62 away from the second protective layer 61, and the second cover layer 64 is disposed on the side of the touch layer 63 away from the second protective layer 61. The orthographic projection on the touch layer 63 of an edge line of an end of the second cover layer 64 is located within the touch layer 63, so that part of the touch layer 63 is exposed to form the second bonding area of the touch module 6. That is, the second cover layer 64 does not completely cover the touch layer 63, but only covers a part of the touch layer 63, so that a part of the touch layer 63 is exposed to form the second bonding area of the touch module 6. The materials of the first cover layer 62 and the second cover layer 64 may be UV glue, that is, photosensitive glue. The thickness of the first cover layer 62 and the second cover layer 64 is approximately 2 microns. The bonding glue layer may be conductive particle glue with a diameter greater than or equal to 5 microns and less than or equal to 10 microns. That is, the diameter of the conductive particles in the conductive particle glue is greater than or equal to 5 microns and less than or equal to 10 microns. The diameter of conductive particles is set to be relative small for facilitating circulation. But it is easy to be squeezed out more during bonding, which is not conducive to bonding. When the diameter of conductive particles is set to be relatively large, it is not easy to be squeezed out more, thus being conducive to bonding, but it is easy to aggregate and cause a short circuit. Through lots of experiments, conductive particle glue with a diameter greater than or equal to 5 microns and less than or equal to 10 microns is less likely to be squeezed out during bonding, which is more conducive to bonding, and is less likely to aggregate and cause short circuits. Of course, the materials of the first cover layer 62 and the second cover layer 64 may also be an optical material such as Cyclic Olefin Polymer (COP), polyimide resin, or the like.

In an exemplary embodiment, the flexible circuit board may further include a protective film 12, which is provided in the bending area 2 on the side of the flexible substrate 3 away from the conductor layer 42. The protective film 12 can protect the flexible substrate 3. On the other hand, the strength of the flexible substrate 3 itself can be improved to avoid breakage, making it not easy to deform under external conditions, and helping to maintain the bending appearance. Also, it is not easy to cause the risk of cracks in the flexible circuit board during installation or use of the whole machine.

Further, an example embodiment also provides a method for manufacturing a flexible circuit board, configured to manufacture the flexible circuit board described in any one of the above embodiments. The manufacturing method may include the following steps: after performing a shadow process on the via holes and before forming the photoresist, a first conductive material layer is formed on the conductor layer 42 by flash plating.

Figure 8:
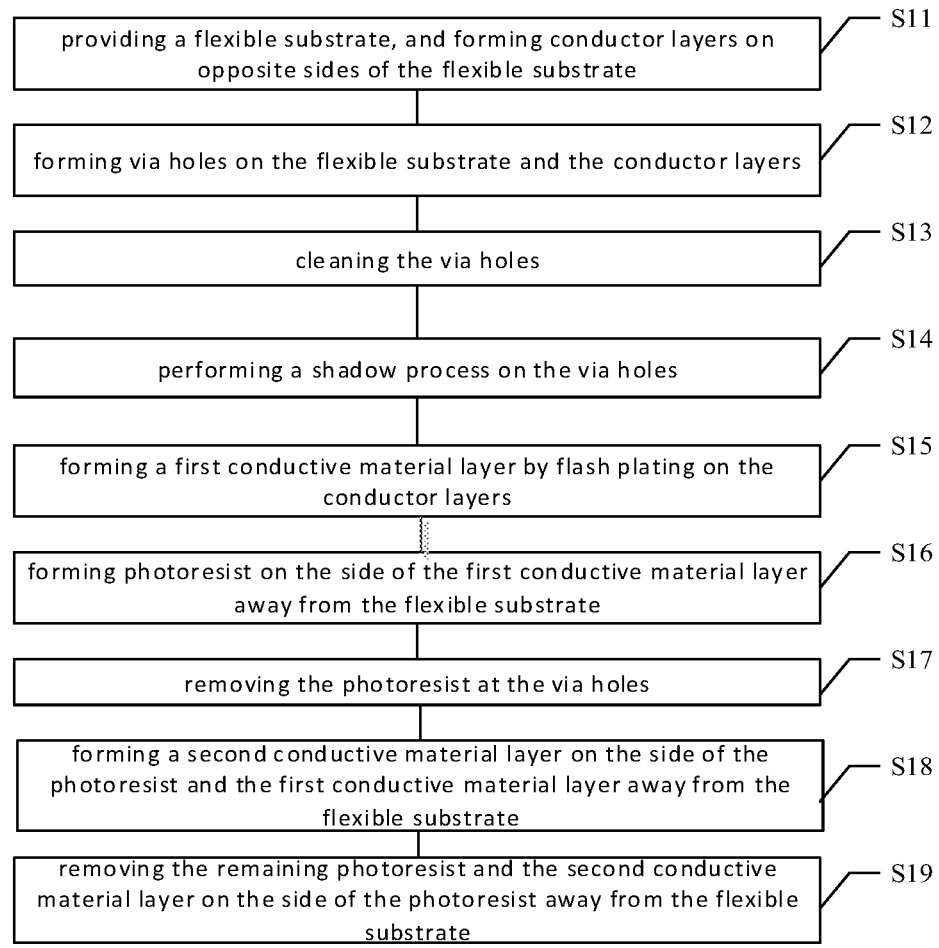
FIG. 8 schematically shows a flowchart of a method for manufacturing a flexible circuit board in an exemplary embodiment of the present disclosure.

Referring to FIG. 8, the method for flash-plated a flexible circuit board may include the following steps.

In step S11, a flexible substrate is provided, and conductor layers are formed on opposite sides of the flexible substrate.

In step S12, via holes are formed on the flexible substrate and the conductor layer.

In step S13, the via holes are cleaned.

In step S14, a shadow process is performed on the via holes.

In step S15, a first conductive material layer is formed by flash plating on the conductor layer.

In step S16, a photoresist is formed on the side of the first conductive material layer away from the flexible substrate.

In step S17, the photoresist is removed at the via holes.

In step S18, a second conductive material layer is formed on the side of the photoresist and the first conductive material layer away from the flexible substrate.

In step S19, the remaining photoresist and the second conductive material layer on the side of the photoresist away from the flexible substrate are removed.

Specifically, a flexible substrate 3 is provided, and the material of the flexible substrate 3 can be polyimide, polyester, or the like. A conductive material layer can be fitted onto both sides of the flexible substrate 3 by pressing. The thickness of the conductive material layer is about 12 microns, and the material of the conductive material layer can be high ductility copper. The conductive material layer subsequently forms the first bonding pins 41 and the first conductive metal layer 131 of the conductor layer 42. Then, a thinning process can be performed on the conductive material layer. Via holes are formed on the conductive material layer and the flexible substrate 3 by laser drilling. That is, the via holes penetrate through the conductive material layer and the flexible substrate 3. Then, the via holes are cleaned to remove the residue generated when the via holes are formed. Next, a shadow process is performed on the via holes, to facilitate subsequent electroplating and conduction. Then a flash plating process is performed on the entire surface. That is, a copper layer is formed by flash plating on the side of the conductive material layer away from the flexible substrate 3. The thickness of the copper layer can be greater than or equal to 3 microns and less than or equal to 5 microns, and electroplating will be also performed at the via holes, thus causing part of the copper to be deposited on the wall of the via holes, so that the entire device has been turned on. The copper layer formed by flash plating subsequently forms the first bonding pins 41 and the second conductive metal layer 132 of the conductor layer 42. Then photoresist is applied on the side of the flash-plated copper layer away from the flexible substrate 3, and then the photoresist is exposed and cleaned at the via hole positions. Thus, the flash-plated copper layer at the via hole positions is exposed, while the flash-plated copper layer at other positions continues to be covered by photoresist. Then an electroplating process is carried out on the whole surface. However, due to the conductive effect of the flash-plated copper layer at the via holes, a large amount of electroplated copper is deposited at the via hole positions, and the electroplated copper is evenly deposited on the photoresist surface at other positions. Since the flash plating process of the entire surface has been electroplated at the via hole positions, this step further thickens the copper layer at the via hole positions, so as to improve the reliability of the entire flexible circuit board. Finally, the photoresist is removed. At the same time as the photoresist is removed, the electroplated copper layer on the surface of the photoresist will also be removed. Then the thickness and conductivity of the deposited copper at the via hole positions are detected.

In an exemplary embodiment, the materials plated by the flash plating process of the entire surface and the electroplating process of the entire surface are all copper. It is understandable that, in other exemplary embodiments of the present invention, the material plated by the flash plating process of the entire surface and the electroplating process of the entire surface may be materials with good conductivity such as silver and gold.

Since the flexible circuit board according to the present invention is an ultra-thin flexible circuit board, the method for manufacturing a flexible circuit board in the prior art can effectively ensure that only the via holes are covered with electroplated copper. However, due to the thinning of the flexible substrate 3, the manufactured flatness is difficult to guarantee, which makes the manufacture of via hole electroplating more difficult. At the same time, it is relatively difficult to form via holes with a smaller diameter on the flexible substrate 3 due to process limitations after the flexible substrate 3 is thinned according to the present invention. When the photoresist is removed, exposed and developed, there is a part of the remaining photoresist, which makes the electroplated copper layer at the via holes appear inhomogeneous, and even makes a short-circuit phenomenon occur.

Compared with the prior art, the method for manufacturing the flexible circuit board according to the present invention adds a flash plating process on the entire surface after performing the shadow process on the via holes and before the process of photoresist coating. Through the above method, a flexible circuit board with stable performance can be produced. The flexible circuit board manufactured by this method can effectively ensure the conduction. It is verified by experiments that the thickness of the conductive material layer is reduced and the flash-plated copper layer is increased, so as to make the thicknesses of the conductor layer 42 and the conductive layer 52 remain unchanged. However, the thickness of the copper layer at the via holes is increased, and the conductivity is strengthened, thereby significantly enhancing the overall reliability. Therefore, the flexible circuit board manufactured by this method has good mass production.

Figure 9:
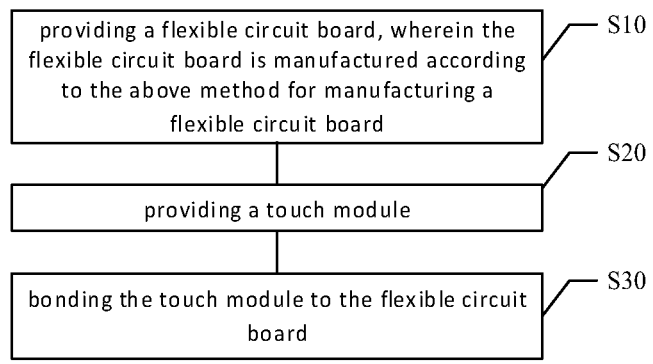
FIG. 9 schematically shows a flowchart of a method for manufacturing a touch panel in an exemplary embodiment of the present disclosure.

Further, an example embodiment also provides a method for manufacturing a touch panel. As shown in FIG. 9, the method for manufacturing a touch panel may include the following steps.

In step S10, a flexible circuit board is provided, and the flexible circuit board is manufactured according to any one of the manufacturing methods of the flexible circuit board described above.

In step S20, a touch module 6 is provided.

In step S30, the touch module 6 is bonded to the flexible circuit board 10.

The steps of the manufacturing method of the touch panel are described in detail below.

The manufacturing method of the flexible circuit board has been described in detail above, so it will not be repeated here.

Figure 10:
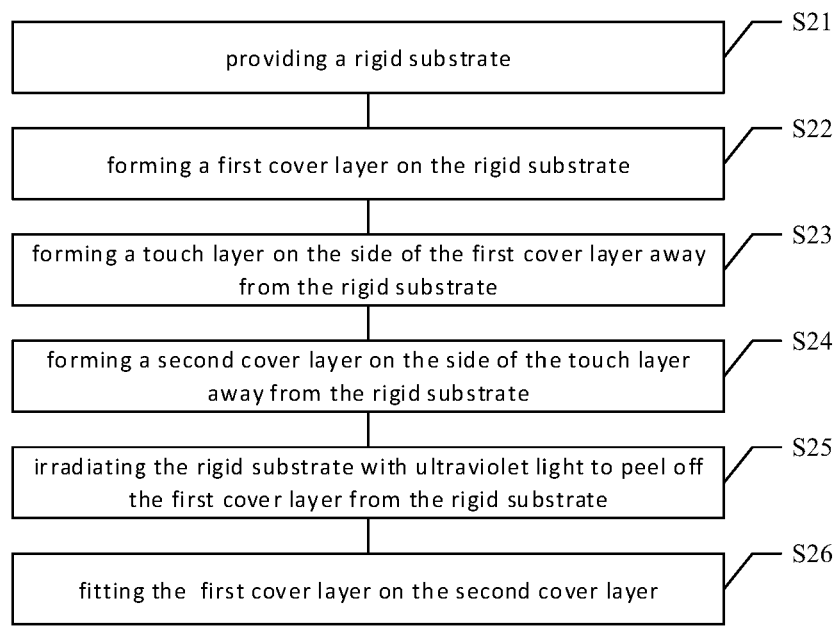
FIG. 10 schematically shows a flowchart of a method for manufacturing a touch module in an exemplary embodiment of the present disclosure.

Before providing a touch module 6, it is required to manufacture the touch module 6. As shown in FIG. 10, the method of manufacturing the touch module 6 may include the following steps.

In step S21, a rigid substrate 65 is provided.

In step S22, a first cover layer 62 is formed on the rigid substrate 65.

In step S23, a touch layer 63 is formed on the side of the first cover layer 62 away from the rigid substrate 65.

In step S24, a second cover layer 64 is formed on the side of the touch layer 63 away from the rigid substrate 65.

In step S25, the rigid substrate 65 is irradiated with ultraviolet light to peel off the first cover layer 62 from the rigid substrate 65.

In step S26, the first cover layer 62 is fitted onto the second protective layer 61.

Figure 11:
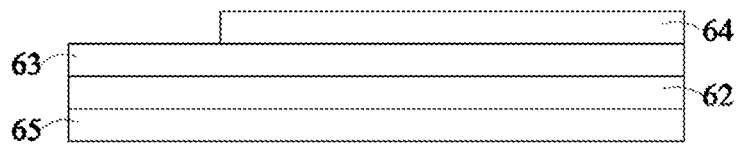
FIG. 11 schematically shows a structural diagram with respect to a step in a method for manufacturing a touch module in an exemplary embodiment of the present disclosure.

Specifically, referring to FIG. 11, a rigid substrate 65 is provided, and the rigid substrate 65 is made of transparent glass. A first cover layer 62 is formed on the rigid substrate 65 through processes such as coating and printing. The material of the first cover layer 62 is photosensitive glue, that is, UV glue. The touch layer 63 is formed on the side of the first cover layer 62 away from the rigid substrate 65 through coating, printing, deposition, evaporation and plating, and other processes. The touch layer 63 is subjected to photolithography and other processes to form a required pattern. A second cover layer 64 is formed on the side of the touch layer 63 away from the rigid substrate 65 through processes such as coating, printing, and deposition. The material of the second cover layer 64 is photosensitive glue, that is, UV glue. The rigid substrate 65 is irradiated with ultraviolet light to peel off the first cover layer 62 from the rigid substrate 65, so that the first cover layer 62, the touch layer 63 and the second cover layer 64 are all separated from the rigid substrate 65. Finally, the first cover layer 62 is fitted onto the second protective layer 61 to form the structure shown in FIG. 7. The material of the second protective layer 61 is the optical material COP.

Since the method for manufacturing the touch module 6 uses the first cover layer 62 and the second cover layer 64, the touch layer 63 can be well protected when bending, and at the same time, the method can make the production of the entire touch layer 63 on glass, thus achieving good flatness. Therefore, the touch layer 63 can achieve a manufacturing process for a 100 nm-level composite layer. That is, the thickness of the touch module 6 is about 100 nm.

Figure 13:
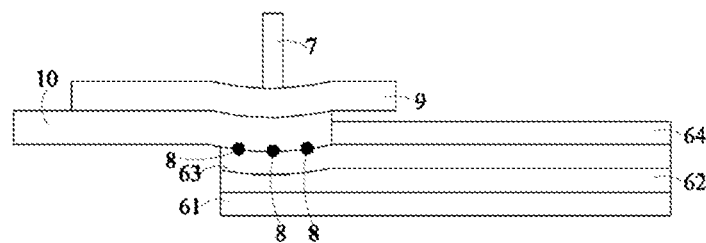
FIG. 13 schematically shows a schematic structural view when the bonding indenter is pressed against the edge middle area of the first bonding pin in an exemplary embodiment of the present disclosure.
Figure 14:
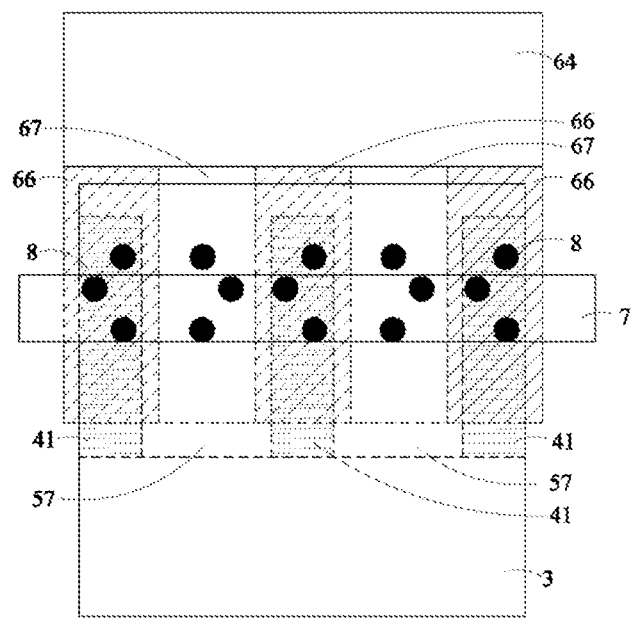
FIG. 14 schematically shows a top structural view of FIG. 13.

Compared with the prior art method of directly coating the touch layer 63 on the optical material COP, and the thinned structure of the flexible circuit board, the deformation of the touch module 6 during bonding becomes larger. Specifically, referring to FIG. 12, when the bonding indenter 7 is pressed on the edge of the first bonding pin 41, the deformation of the touch module 6 is mainly at the edge position, and at the same time, the lower layer of the touch module 6 undergoes a non-uniform force at the edge, leading to the problem of severely deforming at edge. As a result, the gap between the first trench 57 of the flexible circuit board 10 and the second trench 67 of the touch layer 63 is sharply reduced, which causes the overflow path of the inner conductive particles 8 to be destroyed, and causes the conductive particles 8 to gather. Referring to FIGS. 13 and 14, in an exemplary embodiment, when the touch module 6 is bound to the flexible circuit board 10, a silicone pad 9 is placed between the bonding indenter 7 and the flexible circuit board 10. The silicone pad 9 can protect the flexible circuit board 10. The bonding indenter 7 is pressed on the overlapping part, in the middle area thereof, between the second bonding pins 66 of the touch module 6 and the first bonding pins 41 of the flexible circuit board 10, wherein the middle area refers to the middle area along the length direction of a plurality of first bonding pins 41. Besides, the length of the bonding indenter 7 is greater than the length of the second bonding area, and is also greater than the length of the first bonding area. All the first bonding pins 41 and all the second bonding pins 66 are pressed. When the bonding indenter 7 is pressed on the first bonding pins 41 in the middle area thereof, the force bearing points of the touch module 6 are relatively uniform, and there are deformations in the whole. But the limit deformation becomes smaller than that shown in FIG. 12. For example, the gap between the whole trenches is increased. When the middle area is compressed, the largest deformation is in the middle area, and the deformation at both ends is relatively small, which allows the conductive particles 8 in the middle area to move in both directions. The conductive particles 8 moving to the edge can be eliminated without gathering at the edge. This bonding method is conducive to the flow of conductive particles 8 at the trench of the flexible circuit board 10 from inside to outside. The problem of aggregation of conductive particles 8 is greatly reduced, and the yield of bonding is improved.

Moreover, the combination of the above-mentioned bonding method and the flexible circuit board 10 in an exemplary embodiment further avoids the short circuit caused by the aggregation of conductive particles 8, thus greatly improving the overall reliability.

Figure 15:
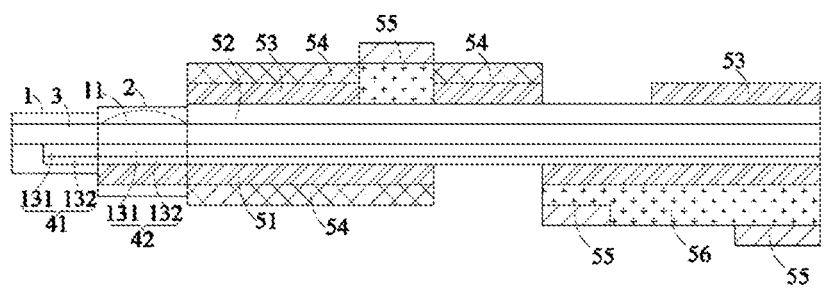
FIG. 15 schematically shows a structural diagram with respect to another step in the method for manufacturing a touch module in an exemplary embodiment of the present disclosure.

As mentioned earlier, in order to ensure the overall characteristics of the display device, the present invention proposes a flexible circuit board and a manufacturing method. The bending area 2 of the flexible circuit board is only provided with the flexible substrate 3, the conductor layer 42, and the first protective layer 51. It is composed of three parts. With this structure, it can be matched with the ultra-thin touch module 6 to ensure good bending characteristics. At the same time, the present invention changes the production process and the design of the first bonding pins 41, and thus the overall performance in various aspects of the module state can be guaranteed stably. However, because this structure will eventually be applied to a foldable terminal, it has a large amount of twisting in the use state. At the same time, because the whole machine will make the bending area 2 to be bent, this makes the flexible circuit board 10 at this position easy to deform or wear. In order to improve the performance of the device, protect the fragile surface of the device, and ensure the process characteristics of the flexible circuit board 10, an exemplary embodiment proposes an outer-side gluing process, wherein in the bending area 2 of the flexible circuit board 10, a protective glue layer 11 is formed on the side of the flexible substrate 3 away from the conductor layer 42, and when the protective glue layer 11 is not dry, the flexible circuit board 10 is bent. Of course, the gluing process can be performed before the bonding process or after the bonding process. As shown in FIG. 15, the protective glue layer 11 is coated on a side of the flexible substrate 3 located at an outer surface of the bending area, wherein the protective glue layer 11 can be UV glue (photosensitive glue), and at the same time, when manufacturing the touch panel, the bending process is completed while the UV glue is not dried. After the subsequent drying of the glue, an ultra-thin protective film 12 will be formed on the surface of the flexible substrate 3. The protective film 12 has the function of protecting the flexible substrate 3 on the one hand, and on the other hand, improving the strength of the flexible substrate 3 itself to avoid breakage. It is not prone to deformation under external conditions, thus maintaining the bending appearance, and is also not prone to the risk of cracks in the flexible circuit board during installation or use of the whole machine. This allows the product to cope with a more severe environment. It has been verified by experiments that this method can effectively improve the defects of the whole machine.

The features, structures, or characteristics described above can be combined in one or more embodiments in any suitable manner. If possible, the features discussed in the embodiments are interchangeable. In the above description, many specific details are provided to give a sufficient understanding of the embodiments of the present invention. However, those skilled in the art will realize that the technical solutions of the present invention can be practiced without one or more of the specific details, or other methods, components, materials, etc. can be used. In other cases, well-known structures, materials, or operations are not shown or described in detail to avoid obscuring aspects of the present invention.

The term "about" and "approximately" used in this specification usually means within 20% of a given value or range, preferably within 10%, and more preferably within 5%. The quantity given here is an approximate quantity, rendering that the meaning of "about", "approximately", "approximately" and "approximately" can still be implied in the absence of specific instructions.

Although relative terms such as "upper" and "lower" are used in this specification to describe the relative relationship between one component represented by an icon and another component, these terms are used in this specification only for convenience, for example, based on the example direction as shown in the drawings. It can be understood that if the device represented by an icon is turned over and turned upside down, the component described as "upper" will become the "lower" component. When a structure is "on" another structure, it may mean that a certain structure is integrally formed on the other structures, or that a certain structure is "directly" installed on the other structures, or that a certain structure is "indirectly" installed on the other structures through a third structure.

In this specification, the terms "a", "an", "the" and "said" are used to indicate the presence of one or more elements/components/etc. The terms "including", "comprising" and "having" are used to mean open-ended inclusion, and means that in addition to the listed elements/components/etc., there may be other elements/components/etc. The terms "first", "second" and "third"", etc. are only used as markers, not as a restriction on the number of objects.

It should be understood that the present invention does not limit its application to the detailed structure and arrangement of the components proposed in this specification. The present invention can have other embodiments, and can be implemented and executed in various ways. The aforementioned deformations and modifications fall within the scope of the present invention. It should be understood that the present invention disclosed and defined in this specification extends to all alternative combinations of two or more individual features mentioned or obvious in the text and/or drawings. All these different combinations constitute multiple alternative aspects of the invention. The embodiments described in this specification illustrate the best mode known for implementing the present invention, and will enable those skilled in the art to utilize the present invention.

What is claimed is:

1. A flexible circuit board, having a first bonding area located at a peripheral region of the flexible circuit board and a bending area located at a middle region of the flexible circuit board, wherein the flexible circuit board comprises:
a flexible substrate;
a plurality of first bonding pins, provided in the first bonding area on the flexible substrate, and used for electrically connecting with a touch module through a conductive bonding adhesive layer, wherein an orthographic projection on the flexible substrate of an edge line of each first bonding pin is located within an edge of the flexible substrate, which edge line is located at an end along an extension direction of a first bonding pin;
a conductor layer, provided in the bending area on the flexible substrate, wherein the conductor layer is connected to the first bonding pins; and
a first protective layer, arranged on a side of the conductor layer away from the flexible substrate,
wherein
the conductor layer comprises a first conductive metal layer and a second conductive metal layer,
each of the first bonding pins comprises the first conductive metal layer and the second conductive metal layer,
the second conductive metal layer is a flash-plated copper layer,
a thickness of the second conductive metal layer is larger than or equal to 3 microns and less than or equal to 5 microns to ensure thicknesses of the first bonding pins and the conductor layer, and
the conductor layer and the first bonding pins are formed by the first conductive metal layer and the second conductive metal layer through a same patterning process.

2. The flexible circuit board according to claim 1, wherein a width of an end of each first bonding pin close to the edge of the flexible substrate is smaller than that of a part of the first bonding pin away from the edge of the flexible substrate.

3. The flexible circuit board according to claim 1, wherein a plurality of notches are provided at an end of the flexible substrate close to the first bonding pins, and each notch is located between two adjacent first bonding pins.

4. The flexible circuit board according to claim 3, wherein a width of an opening part of the notch is greater than a width of a side part of the notch away from the opening part.

5. A touch panel, comprising:
a touch module, having a second bonding area;
a flexible circuit board, wherein a first bonding area of the flexible circuit board is bound to the second bonding area of the touch module; and
a conductive bonding adhesive layer, arranged between the second bonding area of the touch module and the first bonding area of the flexible circuit board,
wherein the flexible circuit board has the first bonding area located at a peripheral region of the flexible circuit board and a bending area located at a middle region of the flexible circuit board, and
wherein the flexible circuit board comprises:
a flexible substrate;
a plurality of first bonding pins, provided in the first bonding area on the flexible substrate, and used for electrically connecting with the touch module through the conductive bonding adhesive layer, wherein an orthographic projection on the flexible substrate of an edge line of each first bonding pin is located within an edge of the flexible substrate, which edge line is located at an end along an extension direction of a first bonding pin;
a conductor layer, provided in the bending area on the flexible substrate, wherein the conductor layer is connected to the first bonding pins; and
a first protective layer, arranged on a side of the conductor layer away from the flexible substrate,
wherein
the conductor layer comprises a first conductive metal layer and a second conductive metal layer, each of the first bonding pins comprises the first conductive metal layer and the second conductive metal layer,
the second conductive metal layer is a flash-plated copper layer,
a thickness of the second conductive metal layer is larger than or equal to 3 microns and less than or equal to 5 microns to ensure thicknesses of the first bonding pins and the conductor layer, and
the conductor layer and the first bonding pins are formed by the first conductive metal layer and the second conductive metal layer through a same patterning process.

6. The touch panel according to claim 5, wherein the touch module comprises:
a second protective layer;
a first cover layer, arranged on the second protective layer;
a touch layer, provided on a side of the first cover layer away from the second protective layer;
a second cover layer, provided on a side of the touch layer away from the second protective layer, wherein an orthographic projection on the touch layer of an edge line of an end of the second cover layer is located within the touch layer, so that a part of the touch layer is exposed to form the second bonding area of the touch module.

7. The touch panel according to claim 5, wherein the conductive bonding adhesive layer comprises a conductive particle adhesive with a diameter greater than or equal to 5 microns and less than or equal to 10 microns.

8. The touch panel according to claim 5, wherein the flexible circuit board further comprises a protective film, the protective film is provided in the bending area on a side of the flexible substrate away from the conductor layer.

9. A method for manufacturing a touch panel, which method comprises:
provides a flexible circuit board;
providing a touch module; and
bonding the touch module to the flexible circuit board,
wherein the method is configured to manufacture the touch panel comprising:
the touch module, having a second bonding area;
the flexible circuit board, wherein a first bonding area of the flexible circuit board is bound to the second bonding area of the touch module, and the first bonding area of the flexible circuit board is located at a peripheral region of the flexible circuit board; and
a conductive bonding adhesive layer, arranged between the second bonding area of the touch module and the first bonding area of the flexible circuit board, wherein a first bending area of the flexible circuit board is located at a middle region of the flexible circuit board, and
wherein the flexible circuit board comprises:
a flexible substrate;
a plurality of first bonding pins, provided in the first bonding area on the flexible substrate, and used for electrically connecting with the touch module through the conductive bonding adhesive layer, wherein an orthographic projection on the flexible substrate of an edge line of each first bonding pin is located within an edge of the flexible substrate, which edge line is located at an end along an extension direction of a first bonding pin;
a conductor layer, provided in the first bending area on the flexible substrate, wherein the conductor layer is connected to the first bonding pins; and
a first protective layer, arranged on a side of the conductor layer away from the flexible substrate, wherein
the conductor layer comprises a first conductive metal layer and a second conductive metal layer, each of the first bonding pins comprises the first conductive metal layer and the second conductive metal layer,
the second conductive metal layer is a flash-plated copper layer,
a thickness of the second conductive metal layer is larger than or equal to 3 microns and less than or equal to 5 microns to ensure thicknesses of the first bonding pins and the conductor layer, and the conductor layer and the first bonding pins are formed by the first conductive metal layer and the second conductive metal layer through a same patterning process.

10. The method for manufacturing a touch panel according to claim 9, wherein when the touch module is bound to the flexible circuit board, a bonding indenter is pressed against an overlapping part, in a middle area thereof, between a plurality of second bonding pins of the touch module and a plurality of the first bonding pins of the flexible circuit board.

11. The method for manufacturing a touch panel according to claim 9, wherein the touch module is manufactured by a method for manufacturing the touch module before the touch module is provided, the method for manufacturing the touch module comprising:
providing a rigid substrate;
forming a first cover layer on the rigid substrate;
forming a touch layer on a side of the first cover layer away from the rigid substrate;
forming a second cover layer on a side of the touch layer away from the rigid substrate;
irradiating the rigid substrate with ultraviolet light to peel off the first cover layer from the rigid substrate; and
fitting the first cover layer on a second protective layer,
wherein the rigid substrate is made of transparent glass, materials of the first cover layer and the second cover layer are both photosensitive glue, and material of the second protective layer is optical material of Cyclic Olefin Polymer (COP).

12. The method for manufacturing a touch panel according to claim 9, further comprising:
forming, in the first bending area of the flexible circuit board, a protective glue layer on a side of the flexible substrate away from the conductor layer; and
bending the flexible circuit board when the protective glue layer is not dry.

13. The method for manufacturing a touch panel according to claim 9, wherein the flexible circuit board is manufactured by a method for manufacturing the flexible circuit board, the method for manufacturing the flexible circuit board comprising:
after performing a shadow process on via holes and before forming a photoresist, forming a first conductive material layer by flash plating on the conductor layer.

14. The method for manufacturing a touch panel according to claim 13, wherein the method for manufacturing the flexible circuit board further comprises:
before performing the shadow process on the via holes,
providing the flexible substrate, and forming conductor layers on opposite sides of the flexible substrate;
forming the via holes on the flexible substrate and the conductor layers; and
cleaning the via holes,
wherein the photoresist is formed on a side of the first conductive material layer away from the flexible substrate, and
the method further comprises:
after forming the photoresist,
removing the photoresist at the via holes;
forming a second conductive material layer on a side of the photoresist and the first conductive material layer away from the flexible substrate; and
removing a remaining photoresist and the second conductive material layer on a side of the photoresist away from the flexible substrate.

* * * * *